United States Patent [19]

De Bruyne et al.

[11] 4,162,514

[45] Jul. 24, 1979

[54] ARRANGEMENT FOR SEMICONDUCTOR POWER COMPONENTS

[75] Inventors: Patrick De Bruyne, Station Siggenthal; Lutz Niemeyer, Oberrohrdorf, both of Switzerland

[73] Assignee: BBC Brown, Boveri & Company, Limited, Baden, Switzerland

[21] Appl. No.: 834,263

[22] Filed: Sep. 19, 1977

[30] Foreign Application Priority Data

Oct. 27, 1976 [CH] Switzerland .................. 13521/76

[51] Int. Cl.² ............................................. H02H 7/20
[52] U.S. Cl. .......................................... 361/2; 361/1; 361/387; 361/417; 357/79; 174/52 S
[58] Field of Search ................ 361/1, 2, 117, 120, 361/126, 127, 128, 129, 134, 137, 417, 418, 419, 424, 380, 387; 357/72, 74, 79, 80, 81, 84, 85; 200/149 B, 144 C, 144 R, 144 B; 174/52 R, 17 VA, 52 S, 17 CT, 52 H, 17.05

[56] References Cited

U.S. PATENT DOCUMENTS

| | | | |
|---|---|---|---|
| 2,531,007 | 11/1950 | Strom et al. | 200/144 C |
| 2,883,574 | 4/1959 | Pittman | 361/126 X |
| 3,230,411 | 1/1966 | Smith, Jr. | 361/129 X |
| 3,274,458 | 9/1966 | Boyer et al. | 174/17.05 |
| 3,415,963 | 12/1968 | Stacy, Jr. et al. | 200/144 C |
| 3,632,926 | 1/1972 | Heft | 200/144 C |
| 3,812,280 | 5/1974 | Deckert | 174/52 S |
| 3,885,243 | 5/1975 | Weisshaar et al. | 357/79 |
| 3,986,201 | 10/1976 | Herold et al. | 357/74 X |

Primary Examiner—Patrick R. Salce
Attorney, Agent, or Firm—Oblon, Fisher, Spivak, McCelland & Maier

[57] ABSTRACT

An arrangement for semiconductor power components in an installation, in which at least one semiconductor power component is placed between contact pieces and is enclosed in a housing exhibiting an insulator and connecting pieces. The arrangement includes current conductors which promote safety and prevent explosion by absorbing electric arcs formed in the installation. The current conductors are placed laterally adjacent to the contact pieces and annularly surrounding the latter, separated from the interior wall of the insulator by narrow gaps. Additional embodiments of the present invention employ reinforcing elements around the housing, and explosion guards around the housing, thereby further enhancing installation safety.

14 Claims, 6 Drawing Figures

4,162,514

ARRANGEMENT FOR SEMICONDUCTOR POWER COMPONENTS

BACKGROUND OF THE INVENTION

1. Field of the Invention

This invention relates to an arrangement for semiconductor power components used in electricity supply installations, and more particularly to an installation with at least one semiconductor power component placed between contact pieces and enclosed in a housing which has an insulator and connecting pieces.

2. Description of the Prior Art

Such installations with thyristors and diodes as active power components are used extensively in electricity supply installations. Because the modern trend is to use semiconductor power components with correspondingly enlarged dimensions in order to control the constantly increasing currents and voltages, it has already been proposed to enclose the components in a 3 inch×1 inch sized "press pack" standard housing. Due to the very large constant currents (1,000 to 3,000 A), however it is necessary to provide for the protection of the installation safety devices which exhibit a very high reaction current and consequently a high explosion integral. For the most modern installations at present the value of this explosion integral for a sinusoidal current is $$\int i^2 dt = \hat{I}^2/2 \cdot T/2$$

where T/2=pulse time, Î=mean current intensity, for sinusoidal impulses of approximately $35 \cdot 10^6 A^2$ sec. (this value corresponds e.g. to a pulse of 83.7 kA/10 msec). But installations in "press pack" standard housings exhibit an explosion integral of only approx. $1.5 \cdot 10^6 A^2$ sec., which is only a fraction of the value demanded in the most modern existing installations. This value of the explosion integral is attained or exceeded very rapidly, and in particular when a short-circuit current flows in the reverse direction of power components, so that the arc which then develops causes the installation to explode.

SUMMARY OF THE INVENTION

Accordingly, one object of this invention is to provide a novel semiconductor power component installation which reliably provides an explosion safety margin even in the case of short-circuit currents flowing in the reverse direction.

Another object is to produce a semiconductor power component installation which is simple to construct and economic to produce.

These and other objects of the present invention are achieved by providing current conductors which increase explosion safety by absorbing arc feet when an arc is formed. The current conductors are placed laterally adjacent to the contact pieces and annularly surrounding the latter, separated from the interior wall of the insulator by narrow gaps. The width of these gaps are dimensioned so that no looping of the arc occurs in the gap.

The present invention is based on the discovery that arcing occurs preferentially in the case of a semiconductor power component which is defective at the edge. Now it has been discovered by means of a semiconductor power component deliberately damaged at the edge, which was installed in a "press pack" standard housing, that the current flows initially at the defective point. This causes the silicon of the component to melt and evaporate. An arc is formed, which tends to spread in loop-shaped conformation due to the effect of its inherent magnetic field, whilst its feet move apart. Now this arc can transfer to the connecting pieces of the housing and weld them together and also make the pressure in the arrangement increase explosively by the thermal energy which it emits, so that the housing is destroyed mechanically and/or by thermic shock.

By virtue of the measures disclosed in the present invention the buildup of pressure in the housing of the installation is kept low because the annular current conductors restrict the length of the arc and prevent the arc feet from transferring to the connecting pieces, and thus considerably reduce the supply of thermic energy in the interior of the housing. Furthermore, thermic energy is particularly reduced because the arc absorbing current conductors act as a cooling surface for the hot arc gases generated. The gaps between the annular current conductors and the interior wall of the insulator permit a pressure equalization in the arc-free part of the housing and thus likewise contribute to reducing the pressure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
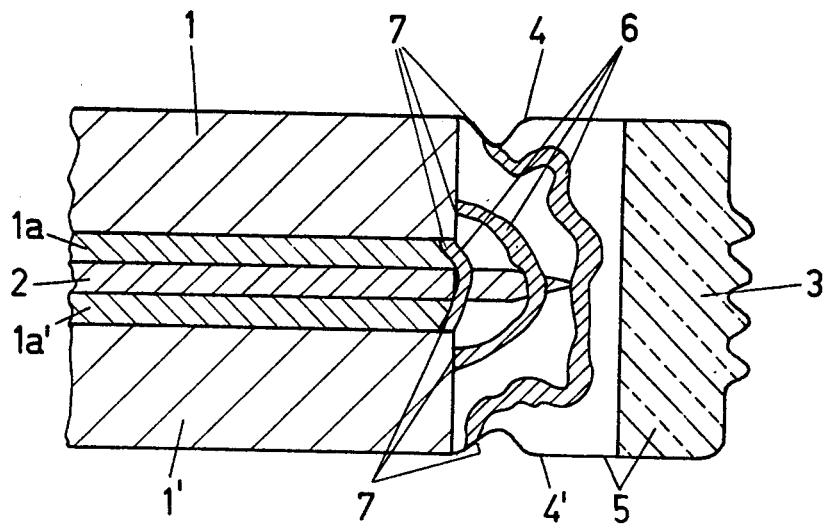
FIG. 1 is a sectional view of an arrangement for semiconductor power components in a "press pack" standard housing, in which an arc spreads in loop-shaped conformation by the effect of its inherent magnetic field.

Referring now to the drawings, wherein like reference numerals designate identical or corresponding parts throughout the several views, and more particularly to FIG. 1 thereof, a semiconductor power component (diode or thyristor) 2 is arranged between contact connections constituted by copper plates 1, 1' and molybdenum plates 1a, 1a'. The component 2 is placed in a cylindrical housing 5 approx. 3 inches in diameter and 1 inch high. The housing 5 comprises a ceramic insulator 3 and flexible connecting pieces 4, 4'. The connecting pieces 4, 4' consist of an alloy containing the elements nickel, cobalt, iron and optionally manganese, e.g. Kovar, and are worked into a flexible plate. The reference numeral 6 designates the different phases of an arc with the feet 7, 7'.

The component 2 exhibits a fault being deliberately damaged at the edge, and is loaded in the backward direction with sinusoidal 10 msec pulses. Even with the pulses of 17 kA/10 msec, corresponding to a value of approx. $1.5 \cdot 10^6 A^2$ sec for the explosion integral, a current flows at the defective point and melts and vaporizes the silicon. This gives rise to an arc 6 between the two contact pieces, which spreads in loop-shape conformation due to the effect of its inherent magnetic field, whilst its feet 7, 7' move apart, transfering to the connecting pieces 4, 4' made of Kovar and welding them together. The thermic energy supplied by the arc leads even for an explosion integral value of only $1.5 \cdot 10^6 A^2$ sec, to a pressure build-up which destroys the housing mechanically and/or explosively by thermic shock effect.

Figure 2:
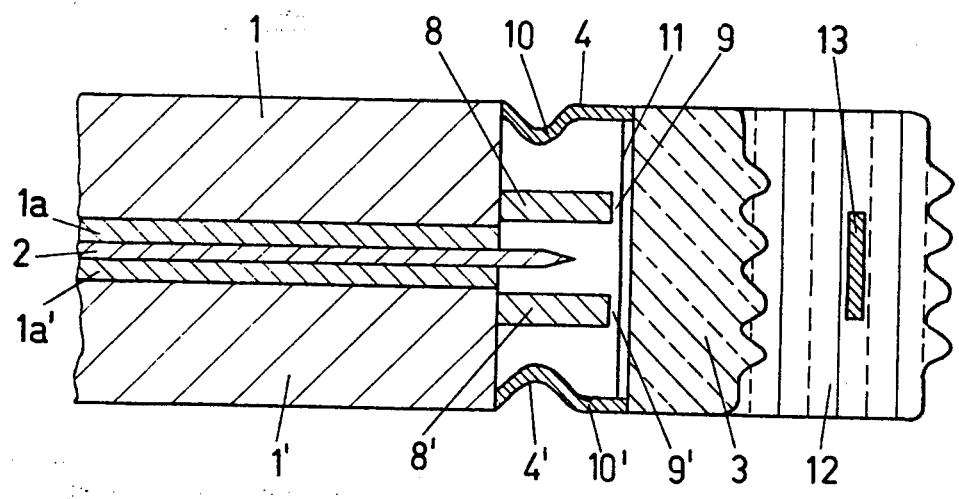
FIG. 2 is a sectional view of an installation according to the present invention and FIGS. 3a, b, c and d are sectional views of further particularly advantageous embodiments of the installation according to the invention.
Figure 3:
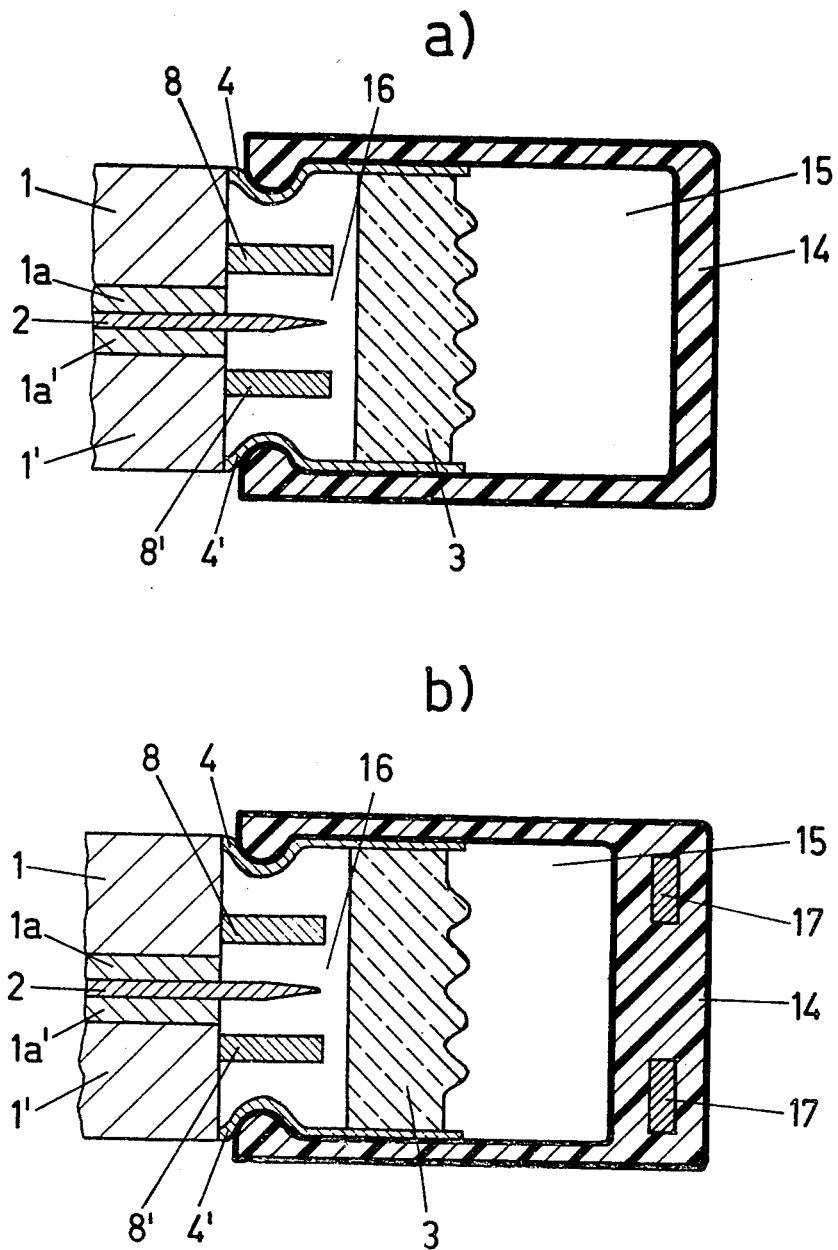
Figure 3:
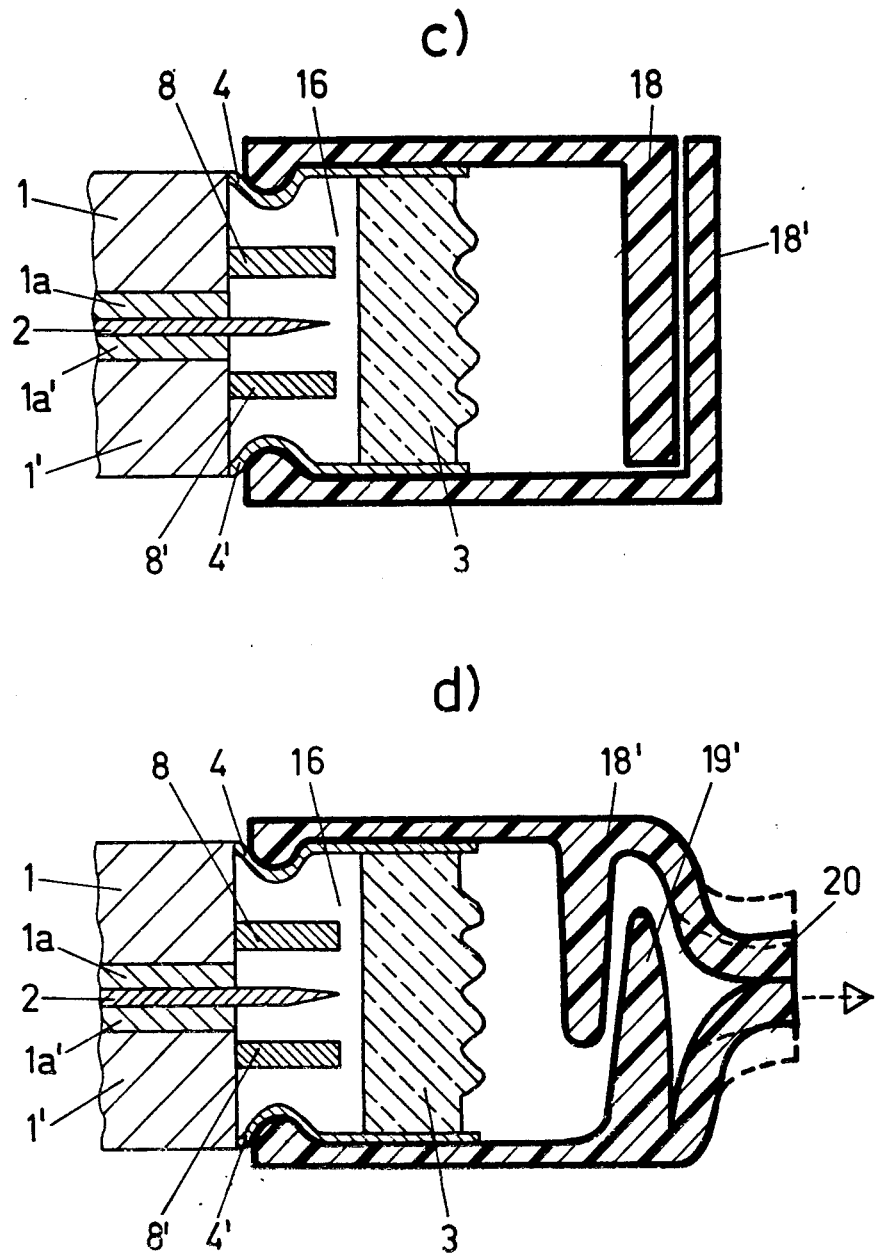

These undesirable effects are obviated or reduced quite considerably by the arrangements for semiconductor power components illustrated in FIGS. 2 and 3.

In FIGS. 2 and 3 identical parts are designated by the same reference numerals as in FIG. 1. In addition, FIG. 2 shows current conductors 8, 8' laterally adjoining the contact pieces and surrounding the latter annularly, being separated from the interior wall of the insulator 3 only by narrow gaps 9, 9'.

It is also convenient to provide the interior wall of the connecting pieces of the housing with a thermically and electrically insulating first coating, and optionally the interior wall of the insulator with a thermically insulating second coating. The reference numeral 10, 10' and 11 designate the coatings of the connecting pieces 4, 4' and of the insulator 3 respectively. By this means the explosion safety of the installation is increased very considerably, because the coating of the connecting pieces retards the development of arc feet and protects the connecting pieces 4, 4', and possibly also the insulator 3, from the hot arc gases.

According to a preferred embodiment the housing exhibits the shape of a cylinder approximately 7 to 8 cm in diameter and 2 to 3 cm high. The current conductors have a rectangular profile of approx. 2 mm wide and approx. 4 mm long and are arranged with their longitudinal side parallel to the contact surface of the semiconductor power component and with their external wide side approx. 1 mm from the insulator. The first coating may be at least 0.3 mm thick. Such an arrangement is excellently protected from the thermic shock effect of the hot arc gases, principally by virtue of the second coating.

In the case of particularly high pressure and temperature values of the gases heated by the arc in the installation, according to the invention it is sometimes convenient for the housing 5 to be braced, at least in the radial direction, by a reinforcing element 12 made of plastics such as polyvinylchloride or polymethacrylicacidester, and optionally to be reinforced by fiberglass-reinforced cast resin rings or steel ring inlays 13. (see FIG. 2) This reinforcing element 12 is best cast-in in order to ensure good contact with the ceramics. In this case the ceramics may be left smooth because the grooves necessary for the sneak path are applied on the outside of the plastics element.

The arrangement according to the invention illustrated in FIG. 2 therefore differs from that of FIG. 1 by the two current conductors 8, 8', the gaps 9, 9' present between the current conductors and the ceramic insulator, the coatings 10, 10', 11 and the reinforcing rings with the inlaid fiberglass-reinforced cast resin rings or steel ring inlays 13.

The current conductors 8, 8' are made of copper, have a rectangular profile approx. 2 mm wide and approx. 4 mm long, and are arranged with their longitudinal side parallel to the contact surface of the semiconductor component 2 and with their exterior wide side approx. 1 mm away from the insulator 3. The two current conductors 8, 8' retain the arc feet 7, 7' firmly on the two conductors and prevent them from travelling across the contact pieces 1, 1', 1a, 1a' onto the two connecting pieces 4, 4'. The gap formed between these two annular current conductors 8, 8' and the interior wall of the ceramic insulator 3 is, at approx. 1 mm, chosen so short that it is impossible for the arc to form a loop into the gap 9, 9'. The coating 10, 10' of the connecting pieces 4, 4' makes it difficult for arc feet to form and prevents the access of the hot arc gases because they counteract the thermic effect of the arc 7 by vaporization. Plastics with high energy of vaporization, such as Sylgard, in a layer thickness of more than 0.3 mm have been found favorable for the coating 10, 10'. The coating 10, 10' can be applied by spraying, gluing films or by casting.

These measures make it possible for the pressure build-up in the housing to be kept extremely low, because the annular current conductors 8, 8' restrict the arc length and hence reduce the supply of thermic energy. Conductors 8, 8' act additionally as cooling surfaces for the hot arc gases generated. The gaps 9, 9' permit a pressure equilization in the arc-free part of the housing 5 and thus likewise contribute to reducing the pressure. The thermic shock effect of the hot arc gases upon the ceramic insulator 3 is reduced by the coating 11. This coating, like the coating 10, 10' likewise consists of a slow-vaporizing plastics such as Sylgard, a silicone resin encapulant commonly used in electronic assemblies, or Teflon, a tetetraflouroethylene flourocarbon polymer and is applied in corresponding layer thickness.

Further exemplary embodiments of installations according to the present invention may be seen from FIG. 3. In FIG. 3a the reference numeral 14 designates an explosion guard surrounding the housing 5. Explosion guard 14 intercepts the hot gases liberated and fragments thrown out by an explosion. As a result, these hot gases and fragments are kept away from the parts of the installation. The explosion guard 14 is preferably made of cast resin or silicone rubber. The space 15 enclosed between the explosion guard 14 and the housing 5 is considerably greater than the space 16 enclosed by the housing 5. In the case of an explosion of the ceramic insulator 3 of the housing 5 owing to excessive pressure and excessive temperature of the gases enclosed in the housing 5, said gases can expand into the space 15, whereby a considerable pressure reduction is achieved and destruction of the installation by the hot arc gases is prevented.

According to FIG. 3b the explosion guard 14 is additionally provided with reinforcing rings 17 to absorb radial forces. According to FIG. 3c it is composed of two parts 18, 18' interlocking at their end faces for the sake of simplicity of assembly. In the embodiment according to FIG. 3d, flow resistance 19, 19' and sealing lips 20 which perform the function of an overpressure valve, may further be provided. In the case of an explosion, the sealing lips 20 are deformed in the manner shown by dash lines and permit the cooled and hence harmless explosion gases to exit in the direction illustrated.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. An installation for semiconductor power components, said installation including at least one semiconductor power component placed between contact pieces and enclosed in a housing including an insulator having an inner wall surrounding the contact pieces and connected thereto by connecting pieces having an inner wall interior to said housing, wherein, in order to increase the explosion safety of said installation upon the formation of an arc, there is provided the improvement comprising:

current conductors laterally adjoining the contact pieces and annularly surrounding said contact pieces in the immediate vicinity of said semiconductor power component, said current conductors separated from the interior wall of the insulator only by narrow gaps, the width of said gaps dimensioned so that no looping of the arc into the gap occurs.

2. An installation according to claim 1, wherein:
the inner wall of said connecting pieces of said housing is provided with a thermally and electrically insulating first coating.

3. An installation according to claim 2, wherein:
the interior wall of said insulator is provided with a thermally insulating second coating.

4. An installation according to claim 3, wherein:
said insulator is formed of ceramics;
said connecting pieces are formed of an alloy containing the elements nickel, cobalt and iron worked into a flexible plate, said current conductors are formed of copper;
said first coating is formed of plastic with a high energy of evaporation; and,
said second coating is formed of a tetrafluoroethylene fluorocarbon polymer.

5. An installation according to claim 2, wherein:
said housing has the shape of a cylinder approximately 7-8 cm in diameter and 2-3 cm high,
said current conductors have a rectangular profile approximately 2 mm wide and approximately 4 mm long, and are arranged with their longitudinal side parallel to the contact surface of the semiconductor component,
said width of said gap formed by the separation of said current conductors and said insulator is approximately 1 mm. wide, and
said first coating is at least 3 mm. thick.

6. An installation according to claim 5, wherein said alloy further comprises:
the element manganese.

7. An installation according to claim 1, wherein:
said housing is braced at least in the radial direction by a reinforcing element.

8. An installation according to claim 7, wherein said reinforcing element comprises:
plastic selected from the group consisting of polyvinylchloride and polymethacryliacidester.

9. An installation according to claim 8, wherein:
said reinforcing element is further reinforced by fiberglass reinforced cast resin rings.

10. An installation according to claim 8, wherein:
said reinforcing element is further reinforced by steel ring inlays.

11. An installation according to claim 1, wherein:
said housing is surrounded by an explosion guard which is dimensioned so that the space enclosed between said housing and said explosion guard is considerably greater than the space enclosed by said housing.

12. An installation according to claim 11, wherein said explosion guard comprises:
a plastic material.

13. An installation according to claim 12, wherein said explosion guard further comprises:
reinforcing rings imbedded in said plastic material.

14. An arrangement according to claim 11, wherein said explosion guard comprises:
two parts interlocking at their end faces, said parts provided with flow resistances and sealing lips to dissipate overpressure.

* * * * *